US010352979B2

(12) United States Patent
Mirebeau

(10) Patent No.: US 10,352,979 B2
(45) Date of Patent: Jul. 16, 2019

(54) HIGH-VOLTAGE DRY APPARATUS PROVIDED WITH A CONTINUOUS MONITORING DEVICE

(71) Applicant: NEXANS, Paris (FR)

(72) Inventor: Pierre Mirebeau, Villebon sur Yvette (FR)

(73) Assignee: NEXANS, Courbevoie (FR)

( * ) Notice: Subject to any disclaimer, the term of this patent is extended or adjusted under 35 U.S.C. 154(b) by 13 days.

(21) Appl. No.: 15/313,010

(22) PCT Filed: Apr. 2, 2015

(86) PCT No.: PCT/FR2015/050854
§ 371 (c)(1),
(2) Date: Nov. 21, 2016

(87) PCT Pub. No.: WO2015/177419
PCT Pub. Date: Nov. 26, 2015

(65) Prior Publication Data
US 2017/0184651 A1    Jun. 29, 2017

(30) Foreign Application Priority Data
May 20, 2014  (FR) ..................................... 14 54487

(51) Int. Cl.
*G01R 31/02* (2006.01)
*G01R 31/12* (2006.01)

(52) U.S. Cl.
CPC ......... *G01R 31/021* (2013.01); *G01R 31/129* (2013.01); *G01R 31/1263* (2013.01)

(58) Field of Classification Search
None
See application file for complete search history.

(56) References Cited

U.S. PATENT DOCUMENTS

| 4,751,614 | A | * | 6/1988 | Mehnert | ................... | H01B 7/08 |
| | | | | | | 174/106 SC |
| 5,469,067 | A | * | 11/1995 | Endoh | ................... | G01R 31/021 |
| | | | | | | 324/541 |
| 5,530,364 | A | * | 6/1996 | Mashikian | ........... | G01R 31/083 |
| | | | | | | 324/242 |

(Continued)

FOREIGN PATENT DOCUMENTS

FR          2712115         5/1995

OTHER PUBLICATIONS

Search Report dated May 27, 2015.

*Primary Examiner* — Jermele M Hollington
*Assistant Examiner* — Suresh K Rajaputra
(74) *Attorney, Agent, or Firm* — Sofer & Haroun, LLP

(57) ABSTRACT

The invention relates to a high-voltage dry apparatus having a semiconductor layer (2) covered by a metal screen (3), this screen (3) being eliminated so as to expose this semiconductor layer (2) over a length, this cable being connected to an element of equipment having an outer envelope (6) mechanically connected to said screen.
According to the invention, an electronic monitoring arrangement (20) is contained within said envelope (6), this electronic arrangement (20) being electrically connected to an electrical power supply arrangement (21) surrounding said semiconductor layer (2) and to the metal screen (3) of said cable on either side of said length of the exposed semiconductor layer.

8 Claims, 3 Drawing Sheets

(56) References Cited

U.S. PATENT DOCUMENTS

| | | | | |
|---|---|---|---|---|
| 5,854,556 A * | 12/1998 | Steennis | ............ | G01R 31/1272 |
| | | | | 324/536 |
| 5,892,430 A * | 4/1999 | Wiesman | ................. | G01R 1/30 |
| | | | | 324/126 |
| 6,025,560 A * | 2/2000 | De Buyst | ............. | H02G 15/103 |
| | | | | 174/88 C |
| 2003/0151412 A1* | 8/2003 | Gregory | ............... | G01R 15/181 |
| | | | | 324/536 |
| 2006/0054345 A1* | 3/2006 | Mirebeau | ............ | H02G 15/184 |
| | | | | 174/73.1 |
| 2006/0076946 A1 | 4/2006 | Shvach et al. | | |
| 2014/0370741 A1* | 12/2014 | Bolcato | ................ | G01R 15/142 |
| | | | | 439/471 |
| 2015/0204936 A1* | 7/2015 | Fukasawa | ............ | H02B 13/065 |
| | | | | 324/551 |
| 2015/0260777 A1* | 9/2015 | Di Stefano | ........ | G01R 31/1227 |
| | | | | 324/536 |
| 2016/0134094 A1* | 5/2016 | Wentzel | ................... | H02G 1/14 |
| | | | | 174/74 R |

* cited by examiner

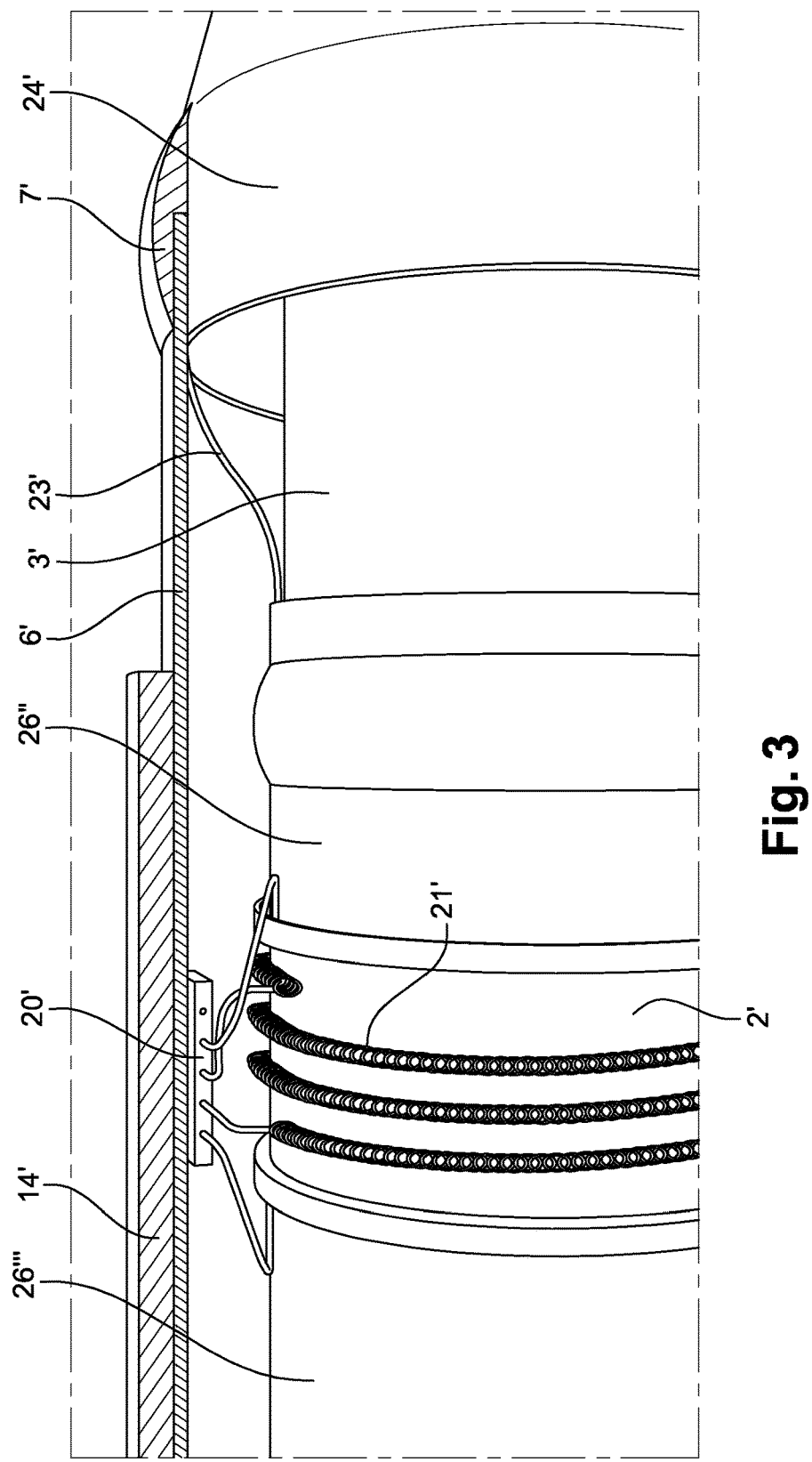

HIGH-VOLTAGE DRY APPARATUS PROVIDED WITH A CONTINUOUS MONITORING DEVICE

RELATED APPLICATION

This application is a National Phase of PCT/FR2015/050584, filed on Apr. 2, 2015 which in turn claims the benefit of priority from French Patent Application 14-54487, filed on May 20, 2014, the entirety of which are incorporated by reference.

BACKGROUND

Field of the Invention

The invention relates to a high-voltage dry apparatus equipped with a continuous monitoring device.

Description of Related Art

Although a known solution for controlling a high-voltage apparatus containing oil is by monitoring the level of this oil and a high-voltage apparatus containing a dielectric gas is by monitoring the pressure of this gas, the monitoring of a dry apparatus can today be carried out by a measurement of the partial discharges preferably continuously, whose principle is for example described in the publication "2009 IEEE Electrical Insulation Conference, Montreal, QC, Canada, 31 May-3 Jun. 2009" in the article "On Line Partial Discharge Diagnosis of Power Cables" at page 210.

For this purpose, the device referred to as "Smart Sensor Grid" manufactured by the company TECHIMP may be used.

This device, whose electronic configuration is described in the patent application WO 2007/144789 for example, is installed on the earth conductor and comprises a detection coil disposed around this conductor.

Such a configuration exhibits the following technical problems.

Disposed on the earth conductor, outside of any protection, this configuration is subject to external interference effects, such as for example overhead power lines, vehicular traffic or the presence of electric motors.

The sensitivity of such a configuration is relatively poor and its improvement, by using a ferrite coil, would be costly. However, in the case of high-voltage terminations or junctions, according to the standards, the sensitivity must be of the order of 5 pico-Coulombs.

Such a device furthermore requires a specific electrical power supply for its continuous use.

OBJECTS AND SUMMARY

The invention solves these problems by equipping a high-voltage dry apparatus with a continuous monitoring device, internal to the apparatus.

The subject of the invention is therefore a high-voltage dry apparatus comprising a high-voltage cable having a semiconductor layer covered by a metal screen, this screen being removed to expose this semiconductor layer over a length, this cable being connected to an element of equipment having an envelope mechanically connected to said screen, characterized in that an electronic monitoring arrangement is contained within said envelope, this electronic arrangement being electrically connected to an electrical power supply arrangement surrounding said semiconductor layer, and to the metal screen of said cable on either side of said length of the exposed semiconductor layer.

The electrical power supply arrangement may directly surround said exposed semiconductor layer or surround it at another location with interposition of a conducting part.

Thanks to the invention, the envelope of the equipment forms a Faraday cage and eliminates the external interference.

Without the need for ferrite, an in-situ capacitive coupling is effected with excellent sensitivity.

The electronic arrangement is self-powered by means of the high-voltage cable.

According to a preferred embodiment, said electronic monitoring arrangement is an arrangement for measuring partial discharges.

However, it may also be an arrangement for measuring current in the metal screens or current to earth, in order to verify the operation of a junction and/or localize an electrical breakdown.

Preferably, said electronic arrangement is also connected to a processing device external to said envelope.

Preferably, said electrical power supply arrangement consists of a current sensor surrounding said exposed semiconductor layer.

Advantageously, said sensor comprises a helicoidal conductor ring surrounding said semiconductor layer.

Said element of equipment may be an termination and said envelope may be a metal cylinder extending the metal housing protecting the termination.

Said element of equipment may be a junction and said envelope may be a metal housing protecting the junction.

BRIEF DESCRIPTION OF THE DRAWINGS

The invention is described hereinafter in more detail with the aid of figures showing FIG. 1 a partial longitudinal cross-sectional view of an apparatus consisting of an end according to the invention.

FIG. 3 is a detailed view of FIG. 2.

DETAILED DESCRIPTION

Figure 1:
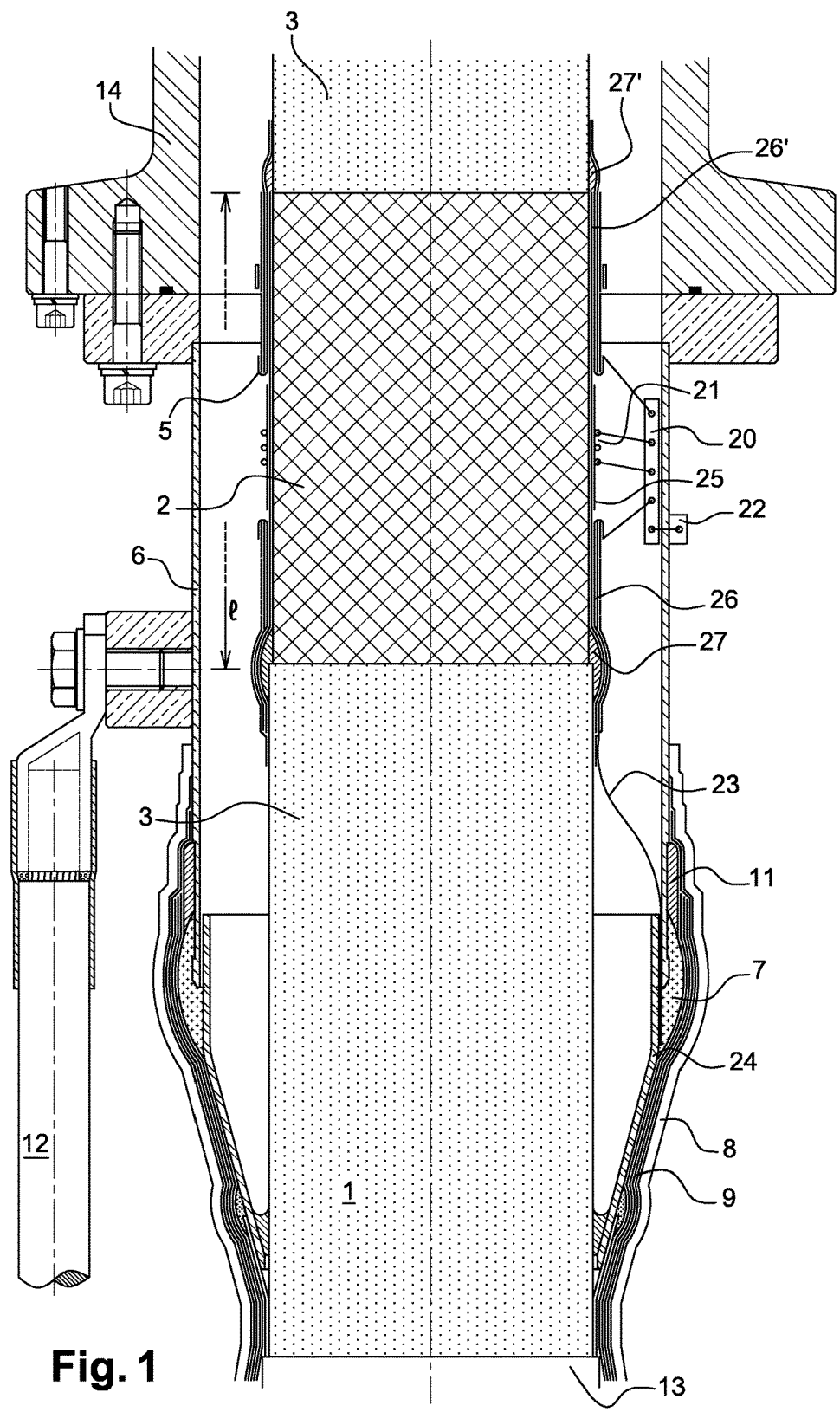

According to FIG. 1, a high-voltage dry apparatus comprises a high-voltage cable 1 having a semiconductor layer 2 covered by a metal screen 3, this screen being eliminated so as to expose this semiconductor layer over a length 1. This cable 1 is connected to an element of equipment, here a termination (not visible) contained within a metal protective housing 14 having an outer metal envelope 6 formed of a metal cylinder extending the metal housing protecting the termination and mechanically connected to the screen 3 of the cable 1, on the opposite side to the termination.

More precisely, the high-energy or very high-voltage cable comprises, from the inside to the outside, around a conductor, an insulating layer, a semiconductor layer 2, a metal screen 3 and an insulating outer sheath 13.

For its connection with the termination, the outer sheath 13 is retracted over a certain length, a solder joint 7 is formed between the metal screen 3 of the cable and the envelope 6 of the element of equipment connected to an earth cable 12 and a connection element is disposed between the cable 1 and the end, coming via one of its ends into contact with the outer sheath of the cable 13 and via its other end into contact with the outer surface of the cylinder 6.

This connection element comprises a section of heat-shrink sleeving 8 thus applied longitudinally between the outer sheath 13 of the cable 1 and the outer surface of the cylinder 6, and an insulating layer 9 is conventionally disposed radially between this section of heat-shrink sleeving 8 and the outer sheath 13 of the cable, the outer surface of the cylinder 6 and the solder joint 7.

The rigid attachment of the section of heat-shrink sleeving 8 to the cylinder 6 of the termination is achieved by soldering of a metal element 11 with anchoring protrusions then application of the section of heat-shrink sleeving 8.

By way of example, such a connection configuration of a high-voltage cable with an element of equipment is described in the patent EP 1 633 028.

According to the invention, an electronic arrangement for measuring the partial discharges 20 is contained within the cylinder 6, this electronic arrangement being connected:

- electrically to an electrical power supply arrangement 21 surrounding the exposed semiconductor layer 2 of the cable,
- electrically to the metal screen 3 of the cable on either side of the length 1 of the exposed semiconductor layer and
- to an external processing device 22, external to the metal cylinder 6, by means of optical fibers or of a radio link.

The electrical power supply arrangement 21 consists of a current sensor surrounding the semiconductor layer 2 of the cable around the length 1 and preferably comprises a helicoidal conductor wound into several turns around the conducting layer 2. A protective insulating strip 25 is interposed between the sensor 21 and the semiconductor layer 2 of the cable, where this strip can have a width of around 50 mm.

By way of example, such a flexible current sensor is marketed by the company Chauvin Arnoux under the name "AmpFLEX".

The electronic arrangement 20 is associated with a transformer of the current sensed by the sensor 21 into a power supply current for this electronic arrangement.

On the side the length 1 of exposed semiconductor layer opposite to the termination, the electronic arrangement 20 is electrically connected to the metal screen 3 of the cable by means of a conductor 23 connected by means of the solder joint 7 to a conical cylinder 24 transition conductor between the cylinder 6 and the screen 3 of the cable and soldered via its distal end to the screen 3 of the cable.

At its end facing the exposed semiconductor layer 2 of the cable, the conductor 23 is rigidly fixed by a sealant joint 27 to a conducting strip 26 surrounding a part of the screen 3 and a part of the semiconductor layer 2 of the cable.

In fact, this conducting strip 26 is composed of a metal braid forming a screen, clamped between a semiconductor strip protecting the semiconductor layer 2 and an outer insulating strip.

On the side of the length 1 of exposed semiconductor layer facing the end, the electronic arrangement 20 is electrically connected to the metal screen 3 of the cable via a conducting strip 26' surrounding a part of the screen 3 and a part of the semiconductor layer 2 of the cable, with a sealant joint 27'. As before, this conducting strip 26' is composed of a metal braid forming a screen, clamped between a semiconductor strip protecting the semiconductor layer 2 and an outer insulating strip.

The external processing device 22 may consist of a detection and/or storage device.

It may be an indicator allowing it to be determined from the outside of the apparatus if the partial discharges exceed an acceptable threshold or a connector allowing the transmission of the measurement data on partial discharges.

According to the embodiment described hereinabove, the element of equipment is a termination and said envelope is a metal cylinder 6 extending the metal housing 14 protecting the termination.

Figure 2:
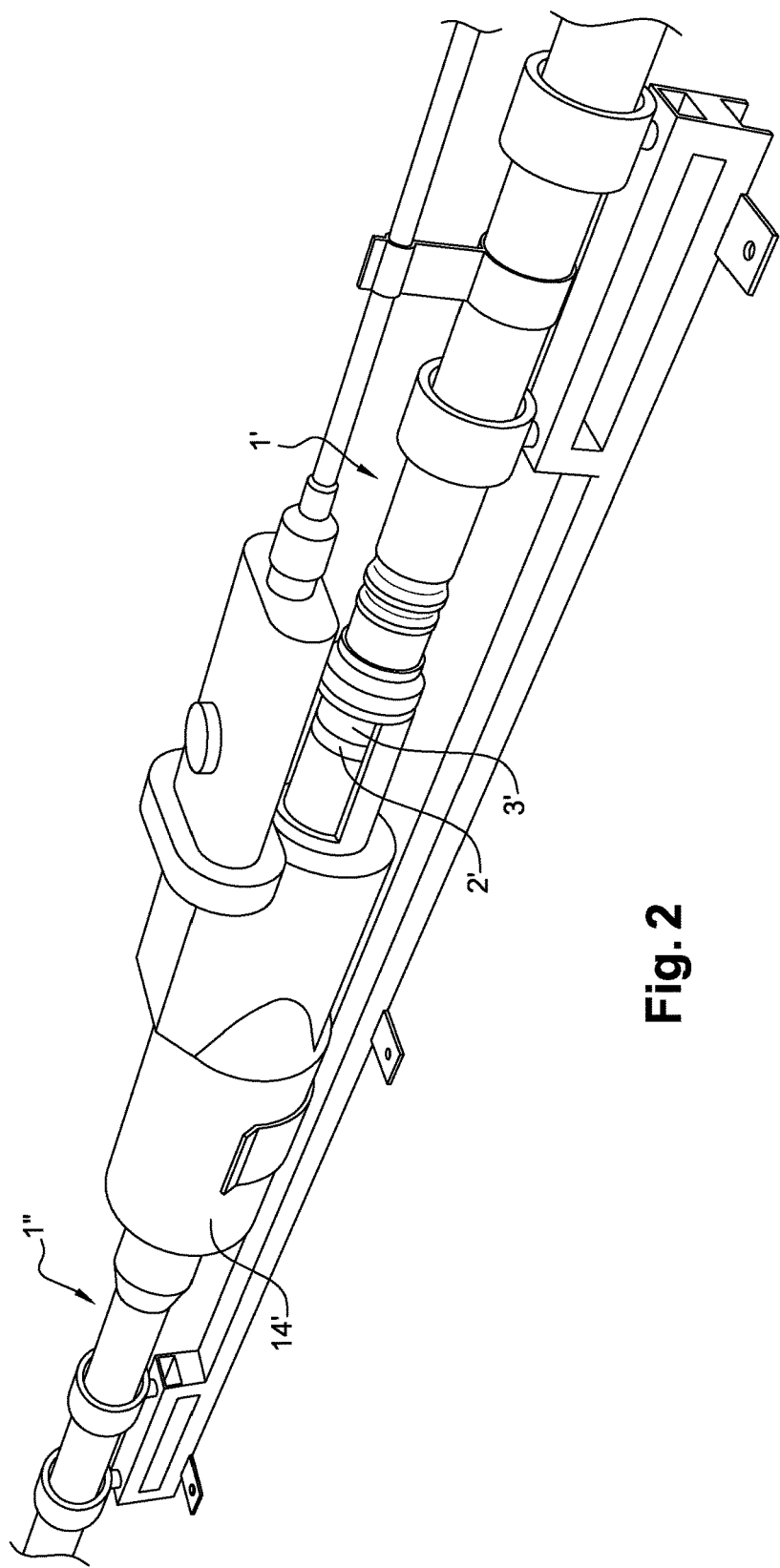
FIG. 2 is a partial longitudinal cross-sectional view of an apparatus consisting of a junction according to the invention.

The invention may also be applied to a junction of cables such as shown in FIGS. 2 and 3.

This high-voltage junction comprises two cables 1', 1" having a semiconductor layer 2' covered by a metal screen 3', a cable here being shown in FIG. 2 by a cross-section.

The screen 3' is eliminated in order to expose the semiconductor layer 2'. The cable 1' is connected to an element of equipment, here a junction contained within a protective metal housing 14' having an outer metal envelope formed from a metal cylinder extending the metal housing protecting the junction and mechanically connected to the screen of the cable 1', on the opposite side to the junction.

More precisely, the high-energy or very high-voltage cable comprises, from the inside to the outside, around a conductor, an insulating layer, a semiconductor layer 2', a metal screen 3' and an invisible outer insulating sheath.

As can be seen in detail in FIG. 3, for its connection with the junction, the outer sheath is retracted over a certain length, a solder joint 7' is formed between the metal screen 3' of the cable and the envelope 6' of the element of equipment connected to an earth cable and a connection element is disposed between the cable 1' and the junction, coming via one of its ends into contact with the outer sheath of the cable and via its other end into contact with the outer surface of the cylinder 6'.

By way of example, such a connection configuration for a high-voltage cable with an element of equipment is described in the patent EP 1 633 028.

According to the invention, an electronic arrangement for measuring the partial discharges 20' is contained within the cylinder 6', this electronic arrangement being connected:

- electrically to an electrical power supply arrangement 21' surrounding the exposed semiconductor layer 2' of the cable,
- electrically to the metal screen of the cable on either side of the exposed semiconductor layer and
- to an external processing device, not shown, external to the metal cylinder 6', by means of optical fibers or of a radio link.

The electrical power supply arrangement 21' consists of a current sensor surrounding the semiconductor layer 2' of the cable and preferably comprises a helicoidal conductor wound into several turns around the conducting layer 2'. A protective insulating strip may be interposed between the sensor 21' and the semiconductor layer 2' of the cable, where this strip can have a width of around 50 mm.

As before, by way of example, such a flexible current sensor is marketed by the company Chauvin Arnoux under the name "AmpFLEX".

The electronic arrangement 20' is associated with a transformer of the current sensed by the sensor 21' into a power supply current for this electronic arrangement.

On the side of the length of exposed semiconductor layer opposite to the junction, the electronic arrangement 20' is electrically connected to the metal screen of the cable by means of a conducting strip 26", of a conductor 23' connected by means of the solder joint 7' to a conical cylinder 24' transition conductor between the cylinder 6' and the screen 3' of the cable and soldered via its distal end to the screen of the cable.

At its end facing the exposed semiconductor layer 2' of the cable, the conductor 23' is rigidly fixed by a sealant joint to the reconstituted section of screen formed by the conducting strip 26".

In fact, this conducting strip 26" is composed of a metal braid forming a screen, clamped between a semiconductor strip protecting the semiconductor layer 2' and an outer insulating strip.

On the side of the exposed semiconductor layer facing the junction, the electronic arrangement 20' is electrically connected to the metal screen of the cable via a conducting strip 26''' surrounding a part of the screen and a part of the semiconductor layer 2' of the cable, with a sealant joint. As before, this conducting strip 26''' is composed of a metal braid forming a screen, clamped between a semiconductor strip protecting the semiconductor layer 2' and an outer insulating strip.

The invention claimed is:

1. High-voltage dry apparatus comprising:
   a high-voltage cable having a semiconductor layer covered by a metal screen, said screen being partially eliminated so as to expose said semiconductor layer over a length, said cable being connected to an element of equipment having an outer envelope mechanically connected to said screen,
   wherein an electronic monitoring arrangement is contained within said envelope, this electronic arrangement being electrically connected to an electrical power supply arrangement surrounding said semiconductor layer and to the metal screen of said cable on either side of said length of the exposed semiconductor layer, forming an in-situ capacitive coupling.

2. The apparatus as claimed in claim 1, wherein said electronic monitoring arrangement is a device for measuring partial discharges.

3. The apparatus as claimed in claim 1, wherein said electronic arrangement is also connected to a communications device external to said outer envelope.

4. The apparatus as claimed in claim 1, wherein said electrical power supply arrangement consists of a current sensor surrounding said exposed semiconductor layer.

5. The apparatus as claimed in claim 4, wherein said sensor comprises a helicoidal conductor surrounding said semiconductor layer.

6. The apparatus as claimed in claim 1, wherein said element of equipment is a termination and said envelope is a metal cylinder extending the metal housing protecting the termination.

7. The apparatus as claimed in claim 1, wherein said element of equipment is a junction and said envelope is a protective metal housing.

8. High-voltage dry apparatus comprising:
   a high-voltage cable having a semiconductor layer covered by a metal screen, said screen being partially eliminated so as to expose said semiconductor layer over a length, said cable being connected to an element of equipment having an outer envelope mechanically connected to said screen,
   wherein an electronic monitoring arrangement is contained within said envelope, this electronic arrangement being electrically connected to an electrical power supply arrangement surrounding said semiconductor layer and to the metal screen of said cable on either side of said length of the exposed semiconductor layer, forming an in-situ capacitive coupling,
   wherein said electronic monitoring arrangement is a device for measuring partial discharges.

* * * * *